United States Patent
Chae et al.

(10) Patent No.: US 7,224,198 B2
(45) Date of Patent: May 29, 2007

(54) INPUT AND OUTPUT CIRCUIT AND METHOD OF OPERATION THEREOF

(75) Inventors: Jeong-Seok Chae, Goynag-si (KR); Yoon-Jay Cho, Seoul (KR); Hyo-Jin Kim, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/226,564

(22) Filed: Sep. 14, 2005

(65) Prior Publication Data

US 2006/0055376 A1    Mar. 16, 2006

(30) Foreign Application Priority Data

Sep. 15, 2004    (KR) .................. 10-2004-0073628

(51) Int. Cl.
    *G06F 1/04*    (2006.01)
(52) U.S. Cl. ......................................... 327/291; 327/78
(58) Field of Classification Search .................. 327/77, 327/78, 291, 294, 299, 93, 59; 324/765; 365/201; 714/718, 729, 745

See application file for complete search history.

(56) References Cited

U.S. PATENT DOCUMENTS 7,017,090 B2 *    3/2006    Endou et al. ............... 714/718

FOREIGN PATENT DOCUMENTS

| JP | 11-327711 | 11/1999 |
|----|-----------|---------|
| JP | 2001-268810 | 9/2001 |
| JP | 2002-186173 | 6/2002 |
| KR | 0312929 | 10/2001 |
| KR | 0280002 | 6/2002 |

OTHER PUBLICATIONS

English Abstract for Publication No.:10-0312929.
English Abstract for Publication No.: 20-0280002.

* cited by examiner

*Primary Examiner*—Linh My Nguyen
(74) *Attorney, Agent, or Firm*—F. Chau & Associates, LLC

(57) ABSTRACT

An input and output circuit includes a common input and output node, an abnormal voltage detector and a clock generating circuit. The common input and output node is used as an output node in a normal operation mode and used as an input node in a test operation mode where an abnormal voltage level is inputted to the common input and output node. The abnormal voltage detector generates an abnormal voltage signal based upon a detection of the abnormal voltage level at the common input and output node in the test operation mode. The clock generating circuit outputs a first clock signal to the common input and output node in the normal operation mode and outputs a second clock signal to an external circuit in response to the abnormal voltage signal in the test operation mode. Therefore, time and expenses for testing the input and output circuit may be reduced.

22 Claims, 5 Drawing Sheets

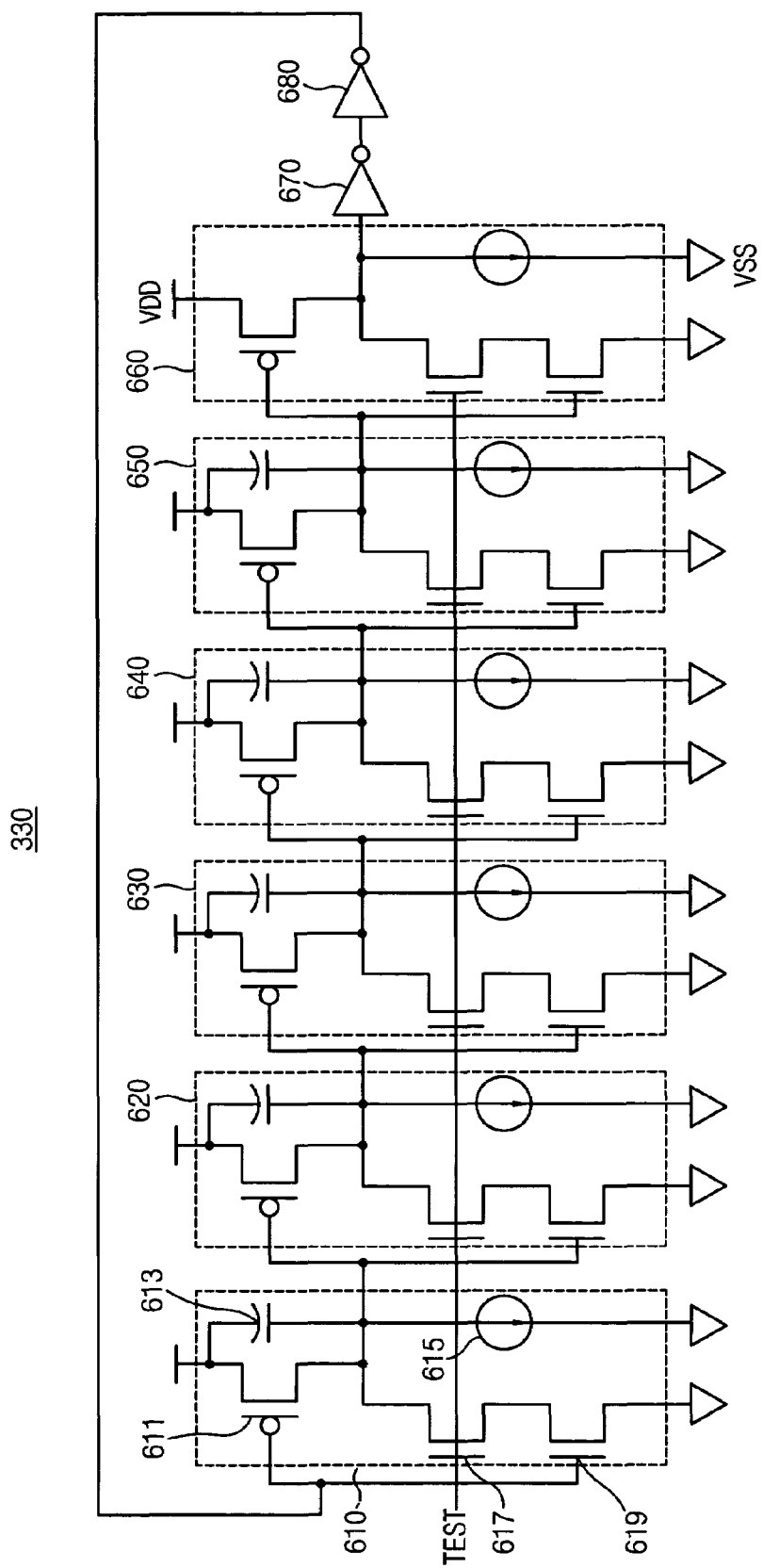

INPUT AND OUTPUT CIRCUIT AND METHOD OF OPERATION THEREOF

CROSS-REFERENCE TO RELATED APPLICATIONS

This application claims priority to Korean Patent Application No. 2004-73628, filed on Sep. 15, 2004, the content of which is hereby incorporated by reference in its entirety.

BACKGROUND OF THE INVENTION

1. Field of the Invention

The present invention relates to an input and output circuit of a semiconductor device and method of operation thereof. More particularly, the present invention relates to an input and output circuit using a common input and output pin, adapted for, for example, a blind time setting circuit of a secondary battery protection circuit, and method of operation thereof.

2. Description of the Related Art

A secondary battery protection circuit used in a secondary battery unit detects an over-charge state, an over-discharge state and an over-current state of a secondary battery such as a lithium-ion battery. The secondary battery protection circuit performs an appropriate operation to protect the secondary battery in accordance with the detected state.

In the case when an over-charge state, over-discharge state or over-current state of the secondary battery is caused by a brief fluctuation in current or voltage, there is no need for the protection operation. Therefore, a secondary battery protection circuit generally includes a blind time setting circuit that prevents the execution of the protective operation during a predetermined time or blind time even when an over-charge state, over-discharge state or over-current state is detected.

When the secondary battery protection circuit is to be tested, the over-charge state, over-discharge state or over-current state needs to be maintained for a period of time that is longer than the blind time of the secondary battery protection circuit. That is, during a test operation it is not possible to know whether the protection operation properly takes place until the blind time elapses. Therefore, the time and expense of carrying out a test operation may be increased because of the wait time due to the blind time.

An example of a conventional secondary battery protection circuit is disclosed in U.S. Pat. No. 6,518,729, entitled "Secondary battery protection circuit capable of reducing time for functional test" (hereinafter "the '729 patent"). According to the '729 patent, in a test operation mode, the blind time setting circuit reduces the period of a clock signal generated by a clock generation circuit of the blind time setting circuit so that the blind time may be reduced.

FIG. 1 is a block diagram illustrating a conventional blind time setting circuit. Referring to FIG. 1, the conventional blind time setting circuit includes a clock generating circuit 110 and a delay time generating circuit 120. The clock generating circuit 110 generates a clock signal upon detecting an over-charge state, an over-discharge state or an over-current state of the secondary battery, and outputs the clock signal to the delay time generating circuit 120. When a test signal TEST having an active state is inputted to the clock generating circuit 110 in the test operation mode, the clock generating circuit 110 reduces the period of the clock signal generated thereby.

To reduce the period of the clock signal, the clock generating circuit 110 controls the current flowing through a capacitor in a plurality of charging/discharging units. In the test operation mode, the current flowing through the charging/discharging units may be increased to speed up the charging/discharging operation of the capacitor, resulting in a reduction in the period of the clock signal.

The delay time generating circuit 120 receives the clock signal generated by the clock generating circuit 110 and outputs instruction signals, i.e., over-charge instruction signals, over-discharge instruction signals, and over-current instruction signals. The respective blind times are preset for the over-charge state, over-discharge state and over-current state. In accordance with the instruction signals, the secondary battery protection circuit performs the protection operations. When the period of the clock signal generated by the clock generating circuit 110 is reduced in the test operation mode, the delay times of the respective instruction signals (i.e., blind times) outputted from the delay time generating circuit 120 are also reduced.

FIG. 2 is a circuit diagram illustrating the clock generating circuit 110 shown in FIG. 1. Referring to FIG. 2, the clock generating circuit 110 includes a plurality of charging/discharging units 210. Each of the charging/discharging units 210 includes a charging/discharging unit 211, a capacitor 213, a charging/discharging current source 215, a regulation transistor 217 and a test current source 219.

The regulation transistor 217 is turned on when the test signal TEST has an active state so that a test current ITEST flows through the regulation transistor 217. When the test signal TEST is inputted to the clock generating circuit 110, a current through a capacitor 213 increases, reducing the period of the clock signal generated by the clock generating circuit 110. Therefore, a test mode operation time may be reduced.

However, the clock generating circuit 110 shown in FIGS. 1 and 2 uses a separate input and output pin for the test mode operation using the reduced clock signal period. The use of separate input and output pins (I/O pins) may increase package size and cost. Moreover, additional current consumption may increase substrate noise that can degrade system performance.

In the clock generating circuit 110 shown in FIGS. 1 and 2, the clock signal outputted from the clock generating circuit 110 is provided to the delay time generating circuit 120, and the clock signal frequency of the clock signal generated by the clock generating circuit 110 cannot be checked externally. In a semiconductor device manufacturing process, it is necessary to measure the output clock signal of the clock generating circuit several times to perform a precise correction to a desired target value when the clock signal frequency of the clock generating circuit has a frequency error or if each of the charging/discharging units 210 has a delay time distribution. According to the '729 patent, the output clock signal of the clock generating circuit 110 is only measured through the delay time generating circuit 120 so that the measuring time may be increased. The clock generating circuit 110 shown in FIG. 2 further includes a separate test current source 219, thereby increasing hardware complexity.

SUMMARY OF THE INVENTION

Exemplary embodiments of the present invention provide an input and output circuit of a semiconductor device, which has a common input and output node that is alternatively used as an input node and as an output node according to a detection of an abnormal voltage level.

Exemplary embodiments of the present invention provide a method of operating an input and output circuit, which has a common input and output node that is alternatively used as an input node and as an output node according to a detection of an abnormal voltage level.

According to one aspect of the present invention, there is provided an input and output circuit, which includes a common input and output node, an abnormal voltage detector and a clock generating circuit. The common input and output node is used as an output node in a normal operation mode and used as an input node in a test operation mode where an abnormal voltage level is inputted to the common input and output node. The abnormal voltage detector generates an abnormal voltage signal based upon a detection of the abnormal voltage level at the common input and output node in the test operation mode. The clock generating circuit outputs a first clock signal to the input and output node in the normal operation mode and outputs a second clock signal to an external circuit in response to the abnormal voltage signal in the test operation mode.

In one embodiment of the present invention, the second clock signal may have a period shorter than the first clock signal.

In one embodiment of the present invention, the abnormal voltage level may be higher than a power supply voltage of the input and output circuit or lower than a ground voltage.

In one embodiment of the present invention, the input and output circuit may further include a switching unit that is closed in the normal operation mode such that the first clock signal of the clock generating circuit is outputted to the common input and output node and opened in the test operation mode such that the second clock signal is electrically disconnected from the common input and output node.

In one embodiment of the present invention, the input and output circuit may further include a delay time generating circuit that generates an output signal delayed by a preset delay time associated with each operation mode based on either the first clock signal or the second clock signal of the clock generating circuit.

In another embodiment of the present invention, there is provided of an input and output circuit of a semiconductor device, which includes a common input and output node, an abnormal voltage detector, an internal node and a switching unit. The common input and output node is used as an output node in a normal operation mode and used in a test operation mode where an abnormal voltage level is inputted to the common input and output node. The abnormal voltage detector generates an abnormal voltage signal based upon a detection of the abnormal voltage level at the common input and output node in the test operation mode. The internal node is activated in response to the abnormal voltage signal in the test operation mode. The switching unit controls a connection between the common input and output node and the internal node such that the common input and output node is coupled to the internal node in the normal operation mode and electrically disconnected from the internal node in the test operation mode.

In one embodiment of the present invention, the abnormal voltage level may be higher than a power supply voltage of the input and output circuit or lower than a ground voltage.

In still another embodiment of the present invention, there is provided of a method of operating an input and output circuit in a semiconductor device. In the method, whether a voltage at a common input and output node has an abnormal voltage level is determined. When the voltage at the common input and output node has a normal voltage level, a first clock signal is outputted to the common input and output node. When the voltage at the common input and output node has the abnormal voltage level, a second clock signal is outputted to an external circuit.

In one embodiment of the present invention, the second clock signal has a period shorter than the first clock signal.

BRIEF DESCRIPTION OF THE DRAWINGS

The present invention will become more apparent to those of ordinary skill in the art when descriptions of exemplary embodiments thereof are read with reference to the accompanying drawings, of which:

FIG. 6 is a circuit diagram illustrating a configuration of the clock generating circuit in FIG. 3, according to an exemplary embodiment of the present invention.

DETAILED DESCRIPTION OF THE EXEMPLARY EMBODIMENTS

Hereinafter, the exemplary embodiments of the present invention will be described in detail with reference to the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
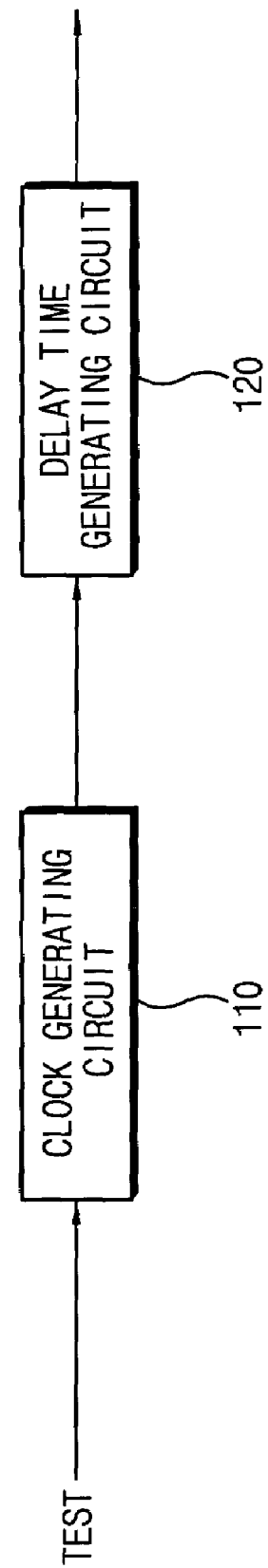
FIG. 1 is a block diagram illustrating a conventional blind time setting circuit.
Figure 3:
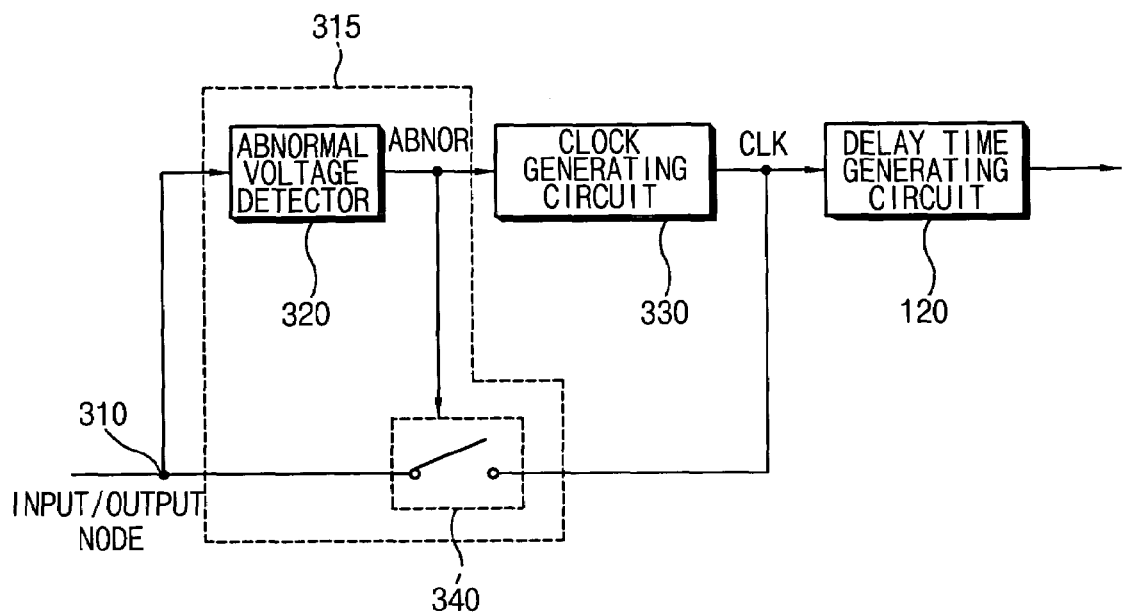
FIG. 3 is a block diagram illustrating an input and output circuit, according to an exemplary embodiment of the present invention.

FIG. 3 is a block diagram illustrating an input and output circuit according to an exemplary embodiment of the present invention. Referring to FIG. 3, the input and output circuit, according to an exemplary embodiment of the present invention, includes an input/output node 310, an input/output switching unit 315, a clock generating circuit 330 and a delay generating circuit 120. The delay generating circuit 120 shown in FIG. 3 may be similar in form and function to that of the delay generating circuit 120 of the conventional blind time setting circuit shown in FIG. 1.

The input/output node 310, according to an embodiment of the present invention, is used as an output node in a normal operation mode and used as an input node in a test operation mode where a voltage having an abnormal voltage level is inputted thereto. In the normal operation mode, an output clock signal CLK of the clock generating circuit 330 having a normal voltage level is outputted to the input/output node 310. For example, the normal voltage level may correspond to a voltage ranging from a ground voltage level to a supply voltage level of the input and output circuit. The abnormal voltage level may correspond to a voltage level lower than a ground voltage VSS, or the abnormal voltage level may correspond to a voltage level higher than a supply voltage VDD.

When an abnormal voltage level is inputted to the input/output node 310 in the test operation mode, the clock generating circuit 330 is electrically disconnected from the input/output node 310 and performs a protection operation based upon the detection of the abnormal voltage level. The clock generating circuit 330 may reduce the period of the output clock signal CLK based upon the detection of the abnormal voltage level to reduce a test operation time for the input and output circuit.

Figure 4:
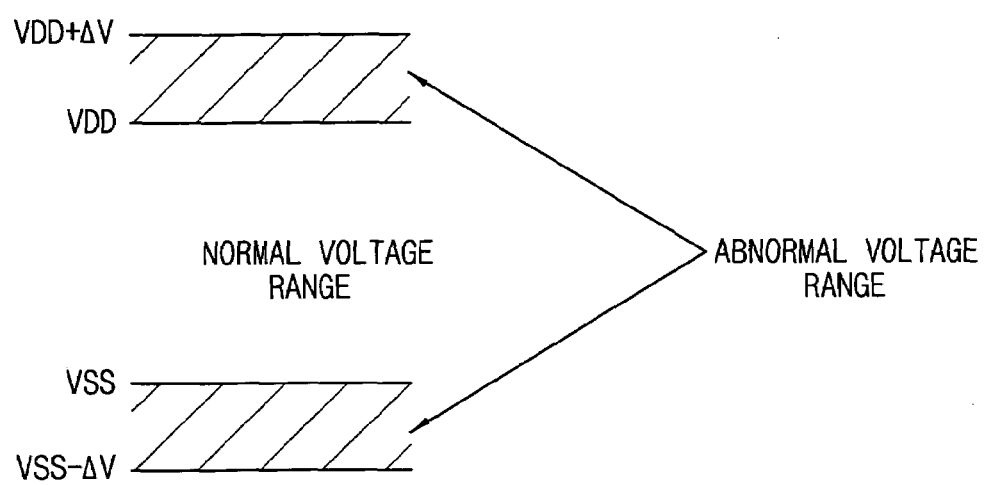
FIG. 4 is a schematic view illustrating a normal voltage range and an abnormal voltage range.

FIG. 4 is a schematic view illustrating a normal voltage and an abnormal voltage.

As depicted in FIG. 4, the normal voltage level is set to be within a range from a voltage level corresponding to the ground voltage VSS to a voltage level corresponding to the supply voltage VDD. Voltage levels that are higher than the supply voltage VDD or lower than the ground voltage VSS are set as the abnormal voltage level.

Referring now to FIG. 3, the input/output switching unit 315 (shown by a dashed line) determines whether a voltage corresponding to the abnormal voltage level is inputted to the input/output node 310, and outputs a result thereof to the clock generating circuit 330. When the input voltage has the normal voltage level, the output of the clock generating circuit 330 is outputted to the input/output node 310. When the input voltage has the abnormal voltage level, the output of the clock generating circuit 330 is electrically disconnected from the input/output node 310. The input/output switching unit 315, according to an embodiment of the present invention, includes an abnormal voltage detector 320 and a switching unit 340.

The abnormal voltage detector 320, in accordance with embodiments of the present invention, determines whether the voltage at the input/output node has an abnormal voltage level. When the input/output node 320 is only used as the output node, the voltage supplied to the input/output node 320 may have a voltage level between the supply voltage VDD and the ground voltage VSS of the input and output circuit. When an abnormal voltage is externally provided to the input/output node 310, the voltage at the input/output node 310 has the abnormal voltage level. The abnormal voltage detector 320 is used to detect the abnormal voltage level (e.g., higher than the supply voltage VDD or lower than the ground voltage VSS) of the voltage at the input/output node 310.

The abnormal voltage detector 320 generates an abnormal voltage signal ABNOR that is activated when the abnormal voltage is detected. The abnormal voltage detector 320, according to an embodiment of the present invention, will be described later in this disclosure.

Figure 2:
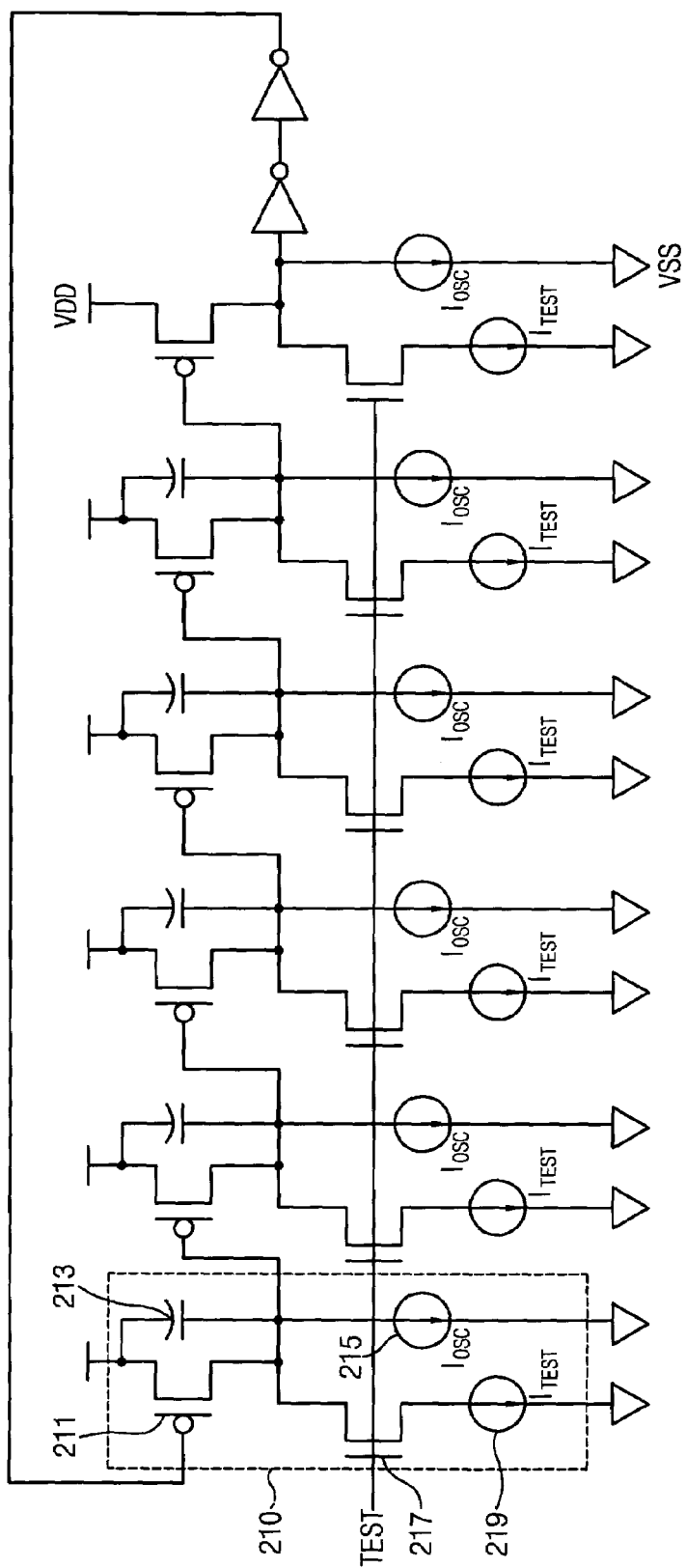
FIG. 2 is a circuit diagram illustrating a configuration of the clock generating circuit 110 shown in FIG. 1.

The clock generating circuit 330 outputs a clock signal having a normal frequency when the abnormal voltage signal ABNOR provided from the abnormal voltage detector 320 is not activated. When the abnormal voltage signal ABNOR is activated, the clock generating circuit 330 generates a test clock signal having a period shorter than the normal period. It should be understood that different circuit configurations of the clock generating circuit 330 other than the circuit configuration shown in FIG. 2 are suitable for implementing the present invention.

The switching unit 340 may couple an output clock signal of the clock generating circuit 330 to the input/output node 310 when the abnormal voltage signal ABNOR is not activated. When the abnormal voltage signal ABNOR is activated, the switching unit 340 disconnects the output clock signal of the clock generating circuit 330 from the input/output node 310 so that the input/output node 310 is used only as an input node.

In accordance with at least one embodiment of the present invention, when the abnormal voltage is not supplied to the input/output node 310, the abnormal voltage detector 320 generates the clock signal having a normal frequency and the switching unit 340 is switched on to output the output clock signal of the clock generating circuit 330 to the input/output node 310, so that the input/output node 310 is used as an output node.

When the abnormal voltage is supplied to the input/output node 310, the abnormal voltage detector 320 generates the abnormal voltage signal ABNOR having an active state. The abnormal voltage signal ABNOR is provided to the clock generating circuit 330 to generate the clock signal having a frequency higher than the normal frequency (i.e., the period of the clock signal becomes shorter).

The switching unit 340 is switched off so as not to output the output clock signal of the clock generating circuit 330 to the input/output node 310. Accordingly, the input/output node 310 is used as an input node.

Figure 5A:
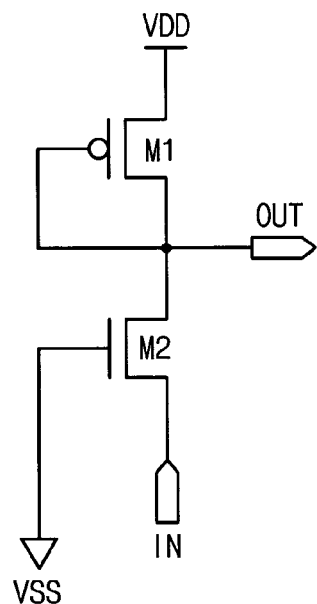
FIG. 5A shows an abnormal voltage detector 320 of the input and output circuit shown in FIG. 3, according to an exemplary embodiment of the present invention.

FIG. 5A is an abnormal voltage detector 320A in FIG. 3, according to an exemplary embodiment of the present invention. Referring to FIG. 5A, the abnormal voltage detector 320A includes a PMOS transistor M1 and an NMOS transistor M2. The PMOS transistor M1 is diode-connected and has a source electrode coupled to the supply voltage VDD and gate and drain electrodes coupled to an output terminal OUT. The NMOS transistor M2 has a gate electrode coupled to the ground voltage VSS, a source electrode coupled to an input terminal IN and a drain electrode coupled to the output terminal OUT.

FIG. 5A shows an exemplary implementation of the abnormal voltage detector 320A using an N-substrate. To secure a proper operation of the abnormal voltage detector 320A, a voltage applied to a P-well in the N-substrate needs to be lower than the ground voltage VSS so as not to operate a parasitic diode formed between the N-substrate and the P-well.

Hereinafter, the operation of the abnormal voltage detector 320A shown in FIG. 5A is described. Referring to FIG. 5A, when the voltage applied to the input terminal IN has a normal voltage level between the supply voltage VDD and the ground voltage VSS, the NMOS transistor M2 is turned off. Therefore, a voltage at the output terminal OUT is maintained, approximating the supply voltage VDD.

When a voltage applied to the input terminal IN has a voltage level lower than the ground voltage VSS minus a threshold voltage of the NMOS transistor M2, the NMOS transistor M2 is turned on. When the NMOS transistor M2 is turned on, a voltage at the output terminal OUT drops to approximately a voltage at the input terminal IN.

The voltage at the output terminal OUT is reduced only when an abnormal voltage lower than the ground voltage VSS is inputted to the input terminal IN of the abnormal voltage detector 320A. By detecting the voltage at the output terminal OUT being reduced, the generation of the abnormal voltage may be detected.

The PMOS transistor M1 in the abnormal voltage detector 320A shown in FIG. 5A, which is used as a load, may be replaced with any different form of load such as a resistant element, current source, etc.

Figure 5B:
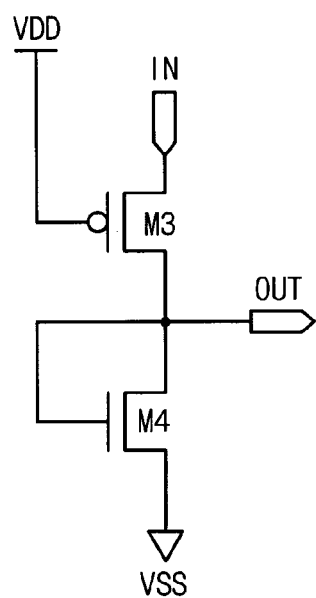
FIG. 5B shows an abnormal voltage detector 320 of the input and output circuit shown in FIG. 3, according to another exemplary embodiment of the present invention.

FIG. 5B is an abnormal voltage detector 320B in FIG. 3, according to another exemplary embodiment of the present invention. Referring to FIG. 5B, the abnormal voltage detector 320B includes a PMOS transistor M3 and an NMOS transistor M4. The NMOS transistor M4 is diode-connected and has a source electrode coupled to the ground voltage VSS and gate and drain electrodes coupled to the output terminal OUT. The PMOS transistor M3, for example, has a gate electrode coupled to the supply voltage VDD, a source electrode coupled to the input terminal IN and a drain electrode coupled to the output terminal OUT.

FIG. 5B shows the abnormal voltage detector 320B using a P-substrate. To secure a proper operation of the abnormal voltage detector 320B, a voltage applied to an N-well in the P-substrate needs to be higher than the supply voltage VDD so as not to operate a parasitic diode formed between the P-substrate and the N-well.

Hereinafter, the operation of the abnormal voltage detector 320B shown in FIG. 5B is described. Referring to FIG. 5B, when the voltage applied to the input terminal IN has a normal voltage level between the supply voltage VDD and the ground voltage VSS, the PMOS transistor M3 is turned off. Therefore, a voltage at the output terminal OUT is maintained, approximating the ground voltage VSS.

When a voltage applied to the input terminal IN exceeds the supply voltage VSS to have a voltage level higher than the supply voltage VDD plus a threshold voltage of the PMOS transistor M3, the PMOS transistor M3 is turned on. When the PMOS transistor M3 is turned on, a voltage at the output terminal OUT increases to approximately a voltage at the input terminal IN.

The voltage at the output terminal OUT is increased only when an abnormal voltage higher than the supply voltage VDD is inputted to the input terminal IN of the abnormal voltage detector 320B. By detecting the voltage at the output terminal OUT being increased, the generation of the abnormal voltage may be detected.

The NMOS transistor M4 in the abnormal voltage detector 320B shown in FIG. 5B, which is used as a load, may be replaced with any different form of load such as a resistant element, current source, etc.

Either of the abnormal voltage detectors 320A and 320B shown in FIGS. 5A and 5B, respectively, may be used as the abnormal voltage detector 320 shown in FIG. 3.

Depending on the abnormal voltage detectors 320A and 320B, an active logical state of the abnormal voltage signal may be defined differently. For example, in the abnormal voltage detector 320A shown in FIG. 5A, a logical "0" of the abnormal voltage signal may be defined as an active state. In the abnormal voltage detector 320B shown in FIG. 5B, a logical "1" of the abnormal voltage signal may be defined as an active state. An inverter may be disposed at the output terminal OUT of the abnormal voltage detector 320 to transition the abnormal voltage signal having a designated logic state to a logic active state.

FIG. 6 is a circuit diagram illustrating the clock generating circuit 330 shown in FIG. 3, according to an exemplary embodiment of the present invention.

Referring to FIG. 6, the clock generating circuit 330 includes a plurality of charging/discharging units 610 through 660. The circuit configuration shown in FIG. 6 is similar to that of the clock generating circuit 110 shown in FIG. 2, except for the charging/discharging units 610 through 660. Therefore, the discussion of the clock generating circuit 330 herein is mainly directed to the charging/discharging units 610 through 660.

The charging/discharging unit 610 shown in FIG. 6 includes a charging/discharging transistor 611, a capacitor 613, a charging/discharging current source 615, a first regulation transistor 617 and a second regulation transistor 619. The charging/discharging transistor 611, the capacitor 613, the charging/discharging current source 615 and the first regulation transistor 617 have forms and functions similar to analogous elements (charging/discharging unit 211, capacitor 213, charging/discharging current source 215 and regulation transistor 217) shown in FIG. 2. In an embodiment of the present invention, the charging/discharging unit 610 further includes a second regulation transistor 619 coupled between the first regulation transistor 617 and the ground voltage VSS, of which a gate electrode is coupled to a gate electrode of the charging/discharging transistor 611.

Each of the charging/discharging units 610 through 660 has the same configuration and only the charging/discharging unit 610 is described herein as representative. However, it will be understood that various configurations are possible for implementing the invention. For example, in one embodiment of the present invention, the charging/discharging unit 660 may not include a capacitor.

The clock generating circuit 330 may further include at least one inverter. In FIG. 6, the clock signal generator circuit 330 includes two inverters 670 and 680.

When the clock generating circuit 330 is implemented as shown in FIG. 6 where a CMOS transistor is additionally included, the circuit configuration employed may be simpler as compared to the clock generating circuit 110 shown in FIG. 2, which includes multiple current sources. Therefore, implementing the clock generating circuit 330 may be easily performed and chip size may be reduced.

When a test signal TEST is inactivated in the charging/discharging unit 610 shown in FIG. 6, the first regulation transistor 617 is turned off so that the charging/discharging unit 610 may operate in the same, or substantially the same, manner as the charging/discharging unit 210 shown in FIG. 2.

When the test signal TEST is activated, the first regulation transistor 617 is turned on and the charging/discharging transistor 611 and the second regulation transistor 619 form a CMOS inverter. The clock generating circuit 330 shown in FIG. 6 may have a structure in which a plurality of inverters are serially connected to one another. The clock generating circuit 330 shown in FIG. 6 may provide a clock signal having a clock signal cycle shorter than a normal mode.

When the test signal TEST is activated, only clock signals for carrying out the test are needed, whereas temperature conditions and voltage conditions are not needed.

The test signal TEST shown in FIG. 6 may correspond to, for example, the abnormal voltage signal ABNOR shown in FIG. 3. For example, the abnormal voltage signal ABNOR is applied to the clock generating circuit 330 to reduce the period of the output clock signal of the clock generating circuit 330 so that a time period required for measuring electrical characteristics of the input and output circuit may be reduced.

According to exemplary embodiments of the present invention, the input and output circuit includes an input and output pin, which may be alternatively used as an output pin for detecting an output clock signal of the clock generating circuit in a normal operation mode and as an input pin to shorten a period of the output clock signal of the clock generating circuit in a test operation mode. Therefore, chip size as well as package size and cost may be reduced.

In addition, by using a common pin as an input and output pin, the current consumption as related to pin number may be reduced. Therefore, substrate noise that degrades performance of the input and output circuit may be reduced.

In addition, the output clock signal of the clock generating circuit may be detected directly from an external portion so that a correction to a desired frequency may be performed.

Although the processes and apparatus of the present invention have been described in detail with reference to the accompanying drawings for the purpose of illustration, it is to be understood that the inventive processes and apparatus are not to be construed as limited thereby It will be readily apparent to those of reasonable skill in the art that various modifications to the foregoing exemplary embodiments may be made without departing from the spirit and scope of the invention as defined by the appended claims.

What is claimed is:

1. An input and output circuit of a semiconductor device, comprising:
    a common input and output node that is used as an output node in a normal operation mode and used as an input node in a test operation mode where an abnormal voltage level is inputted to the common input and output node;
    an abnormal voltage detector configured to generate an abnormal voltage signal based upon a detection of the abnormal voltage level at the common input and output node in the test operation mode; and
    a clock generating circuit configured to output a first clock signal to the common input and output node in the normal operation mode and configured to output a second clock signal to an external circuit in response to the abnormal voltage signal in the test operation mode.

2. The input and output circuit of claim 1, wherein the second clock signal has a period shorter than the first clock signal.

3. The input and output circuit of claim 1, wherein the abnormal voltage level is higher than a power supply voltage of the input and output circuit.

4. The input and output circuit of claim 3, wherein the abnormal voltage detector includes:
    a PMOS transistor configured to turn on in response to the abnormal voltage level and configured to turn off in response to a normal voltage level that is between a ground voltage and the power supply voltage of the input and output circuit; and
    a load configured to transition a voltage at an output terminal of the abnormal voltage detector when the PMOS transistor is turned on.

5. The input and output circuit of claim 4, wherein the load includes a diode-connected NMOS transistor.

6. The input and output circuit of claim 1, wherein the abnormal voltage level is lower than a ground voltage.

7. The input and output circuit of claim 6, wherein the abnormal voltage detector includes:
    an NMOS transistor configured to turn on in response to the abnormal voltage level and configured to turn off in response to a normal voltage level that is between a ground voltage and the power supply voltage of the input and output circuit; and
    a load configured to transition a voltage at an output terminal of the abnormal voltage detector when the NMOS transistor is turned on.

8. The input and output circuit of claim 7, wherein the load includes a diode-connected PMOS transistor.

9. The input and output circuit of claim 1, wherein the clock generating circuit includes at least one charging/discharging unit, wherein each of the at least one charging/discharging unit includes:
    a charging/discharging transistor;
    a capacitor coupled to the charging/discharging transistor in parallel;
    a charging/discharging current source configured to supply a current flowing through the capacitor;
    a first regulation transistor coupled to the capacitor, configured to be turned on when the abnormal voltage level is detected by the abnormal voltage detector; and
    a second regulation transistor configured to form a CMOS inverter in combination with the charging/discharging transistor when the first regulation transistor is turned on.

10. The input and output circuit of claim 1, further comprising a switching unit configured to be closed in the normal operation mode such that the first clock signal of the clock generating circuit is outputted to the common input and output node and configured to be open in the test operation mode such that the second clock signal is electrically disconnected from the common input and output node.

11. The input and output circuit of claim 1, further comprising a delay time generating circuit configured to generate an output signal delayed by a preset delay time associated with each operation mode based on either the first clock signal or the second clock signal of the clock generating circuit.

12. The input and output circuit of claim 1, further comprising a delay time generating circuit for use in a blind time setting circuit of a secondary battery protection circuit, configured to generate an output signal delayed by a preset delay time associated with each operation mode based on either the first clock signal or the second clock signal of the clock generating circuit.

13. An input and output circuit of a semiconductor device, comprising:
    a common input and output node that is used as an output node in a normal operation mode and is used in a test operation mode where an abnormal voltage level is inputted to the common input and output node;
    an abnormal voltage detector configured to generate an abnormal voltage signal based upon a detection of the abnormal voltage level at the common input and output node in the test operation mode;
    an internal node that is activated in response to the abnormal voltage signal in the test operation mode; and
    a switching unit configured to control a connection between the common input and output node and the internal node such that the common input and output node is electrically coupled to the internal node in the normal operation mode and electrically disconnected from the internal node in the test operation mode.

14. The input and output circuit of claim 13, wherein the abnormal voltage level is higher than a power supply voltage of the input and output circuit.

15. The input and output circuit of claim 14, wherein the abnormal voltage detector includes:
    a PMOS transistor configured to turn on in response to the abnormal voltage level and configured to turn off in response to a normal voltage level that is between a ground voltage and the power supply voltage of the input and output circuit; and
    a load configured to transition a voltage at an output terminal of the abnormal voltage detector when the PMOS transistor is turned on.

16. The input and output circuit of claim 15, wherein the load includes a diode-connected NMOS transistor.

17. The input and output circuit of claim 13, wherein the abnormal voltage level is lower than a ground voltage.

18. The input and output circuit of claim 17, wherein the abnormal voltage detector includes:
- an NMOS transistor configured to turn on in response to the abnormal voltage level and configured to turn off in response to a normal voltage level that is between a ground voltage and the power supply voltage of the input and output circuit; and
- a load configured to transition a voltage at an output terminal of the abnormal voltage detector when the NMOS transistor is turned on.

19. The input and output circuit of claim 18, wherein the load includes a diode-connected PMOS transistor.

20. A method of operating an input and output circuit in a semiconductor device, comprising:
- determining whether a voltage at a common input and output node has an abnormal voltage level;
- outputting a first clock signal to the common input and output node when the voltage at the common input and output node has a normal voltage level;
- outputting a second clock signal to an external circuit when the voltage at the common input and output node has the abnormal voltage level; and
- generating an output signal delayed by a preset delay time associated with each operation mode based on either the first clock signal or the second clock signal.

21. The method of claim 20, wherein the normal voltage level corresponds to a voltage level that is between a ground voltage and a power supply voltage of the input and output circuit and wherein the abnormal voltage level corresponds to a voltage level below the ground voltage or a voltage level exceeding the power supply voltage.

22. The method of claim 20, wherein the second clock signal has a period shorter than the first clock signal.

* * * * *